United States Patent [19]

Suffi et al.

[11] Patent Number: 5,001,602

[45] Date of Patent: Mar. 19, 1991

[54] NETWORK INTERFACE CABINET FOR LARGE PAIR COUNT TELEPHONE TERMINATIONS

[75] Inventors: Louis Suffi, Westchester; Wojciech M. Malewski, Lombard, both of Ill.

[73] Assignee: Reliance Comm/Tec Corporation, Cleveland, Ohio

[21] Appl. No.: 456,078

[22] Filed: Dec. 20, 1989

Related U.S. Application Data

[63] Continuation of Ser. No. 276,614, Nov. 28, 1988, abandoned.

[51] Int. Cl.[5] .............................................. H05K 5/00
[52] U.S. Cl. .................................... 361/390; 361/426; 361/428; 361/429
[58] Field of Search ................................. 361/390–391, 361/396, 426, 428–429; 379/327—331

[56] References Cited

U.S. PATENT DOCUMENTS

| | | | |
|---|---|---|---|
| 3,001,102 | 9/1961 | Stiefel et al. | 361/390 |
| 3,188,524 | 6/1965 | Williams | 361/390 |
| 3,320,488 | 5/1967 | Karew et al. | 361/390 |
| 4,002,856 | 1/1977 | Sedlacek et al. | 179/98 |
| 4,160,880 | 7/1979 | Brey | 379/328 |
| 4,307,436 | 12/1981 | Eckart et al. | 361/426 |
| 4,331,839 | 6/1982 | Baumbach | 179/98 |
| 4,605,275 | 8/1986 | Pavel | 379/329 |

*Primary Examiner*—Gregory D. Thompson
*Attorney, Agent, or Firm*—R. A. Blackstone, Jr.

[57] ABSTRACT

A network interface cabinet for large pair count telephone terminations comprises a generally rectilinear cabinet including parallel and spaced top and bottom walls and two pairs of parallel spaced apart sidewalls forming respective front, rear and lateral walls running between and joining the top and bottom walls. At least one access opening is in one of the sidewalls, and a door selectively covers and exposes the access opening for access to the inside of the cabinet. A lock is operatively coupled with the door and the cabinet for controlling access to the inside of the cabinet. Hinges are located interiorly of the cabinet for hingedly mounting at least one equipment panel therewithin for accepting telephone termination, connection and protector equipment, and for permitting access to wiring at both front and rear surfaces of the panel. At least one opening in another of the sidewalls is provided for running cabling between one or more similar cabinets located in a side-by-side arrangement. Panels cover the sidewall openings when not in use. At least one opening in each of said top and bottom walls accommodates incoming and outgoing cables and wiring, and corresponding removable panels are provided for selectively exposing or covering these openings. Suitable mounting structures are provided for mounting the cabinet securely to a floor or other surface, and a grounding system is provided interiorly of the cabinet for grounding of cable jackets and the like entering the cabinet.

10 Claims, 4 Drawing Sheets

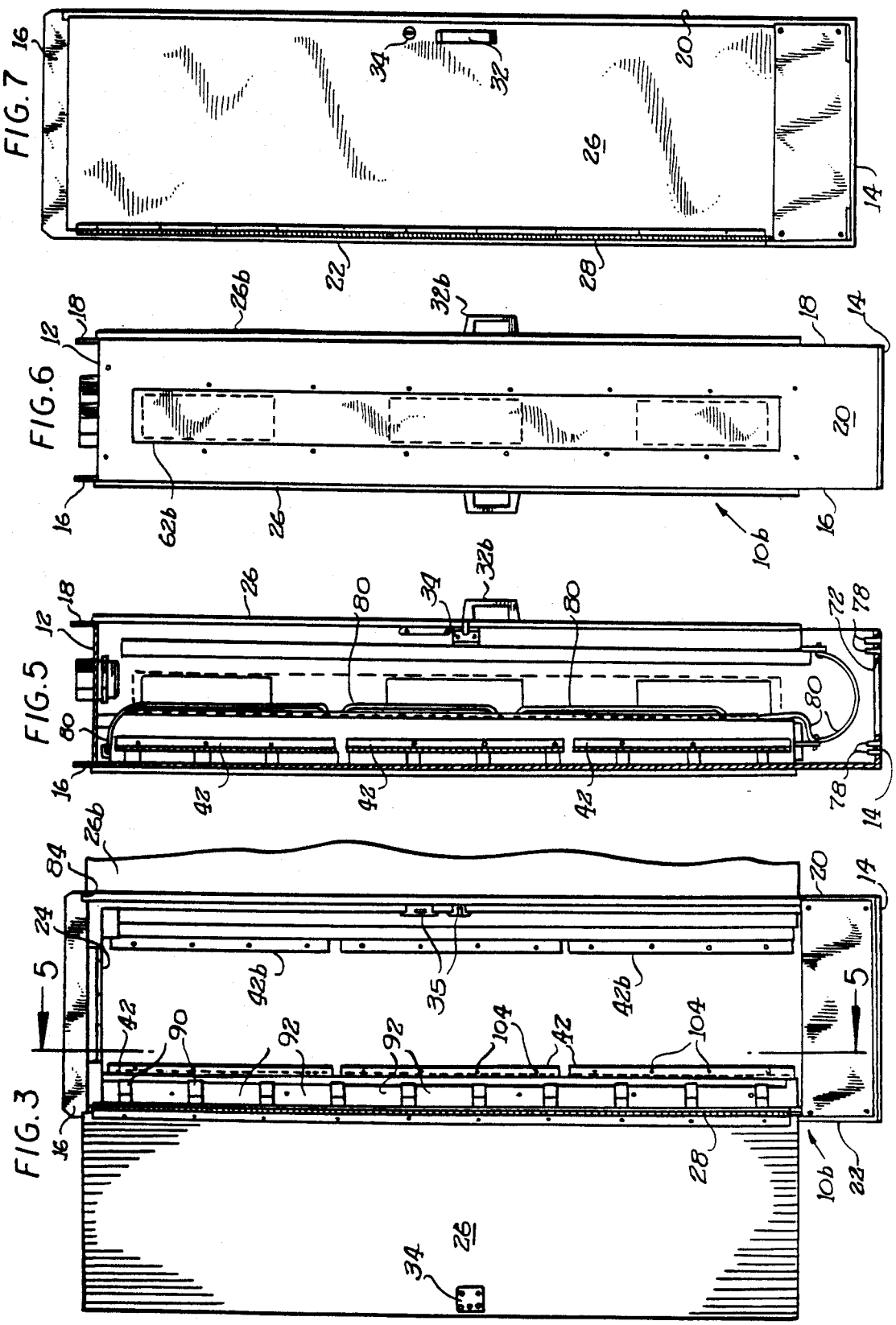

NETWORK INTERFACE CABINET FOR LARGE PAIR COUNT TELEPHONE TERMINATIONS

This application is a continuation of application Ser. No. 276,614, filed Nov. 28, 1988, now abandoned.

BACKGROUND OF THE INVENTION

This invention relates to a cabinet for housing telephone equipment, and more particularly to a novel network interface cabinet for use in bringing a large number of pairs of telephone lines into a subscriber's premises, and for accomplishing an interface between the subscriber's equipment and telephone company equipment.

Telephone operating companies have recently been installing interface devices at subscriber premises to provide a separation or demarcation between the operating company equipment and the subscriber-owned equipment on the subscriber's premises. This arrangement proves particularly helpful in providing a manner in which the subscriber equipment may be selectively connected to, and disconnected from, the telephone company equipment, to thereby determine whether any problem or malfunction which may occur is due to subscriber equipment malfunction or telephone company equipment malfunction. Heretofore, such installations have typically been at single-family residences, thus requiring, typically, only termination of and interfacing between perhaps one or two line pairs. In this regard, each independently accessed telephone or "listed number" generally requires one line pair.

Accordingly, at premises having a large number of subscribers such as apartment complexes, office buildings and the like, considerably more complex equipment is required to provide the same sort of interfacing between company equipment and subscriber equipment. Typically, such premises may contain several hundred independently accessed telephone lines and thus require interfacing between a correspondingly large number of line pairs. Thus, an interface facility for such an installation must include termination and protection for the subscriber's telephone equipment as well as proper distribution from the central office cable pairs entering the premises to the subscriber equipment. In this regard, by protection for subscriber equipment is meant the provision of suitable overvoltage and/or "surge arrester"-type protection for each line pair on the premises.

It is further desirable that such large pair count installations be in fully enclosed cabinets, and that access to such cabinets be strictly controlled. That is, while it is desirable that the telephone operating company have access to all of the equipment for purposes of interconnection, repair and/or diagnostic work, it is also desirable that subscriber access be limited to subscriber-owned equipment only. That is, the subscriber should not have access to the telephone company equipment, cables, etc. on the premises, which are terminated in the cabinet. Accordingly, the interior of the cabinet should preferably be divided in such a way that separate access doors or panels can be provided, each having a suitable locking means for limiting access thereto only to the telephone company, or also permitting access to the subscriber, as desired for each portion of the equipment so segregated or divided within the cabinet.

It is further desirable that such a large pair count network interface system provide for a desired number of line pairs to be accommodated in a modular fashion. That is, it is desirable that one or more easily insertable and removable, and also lockable, modular panels be accepted in the cabinet, each panel providing the protection, distribution and termination facilities for a predetermined large number of subscribers. Such a modular arrangement allows a given installation to be expanded as necessary to accommodate increasing numbers of subscribers on the premises.

OBJECTS AND SUMMARY OF THE INVENTION

Accordingly, it is a general object of the present invention to provide a network interface cabinet for large pair count telephone terminations in accordance with the foregoing considerations.

Briefly, and in accordance with the foregoing discussion, a network interface cabinet for large pair count telephone terminations comprises a generally rectilinear cabinet including parallel and spaced top and bottom walls and two pairs of parallel spaced apart sidewalls forming respective, front, rear and lateral walls running between and joining said top and bottom walls; at least one access opening in one of said sidewalls, door means for selectively covering and exposing said access opening for access to the inside of the cabinet; hinge means located interiorly of the cabinet for hingedly mounting at least one equipment panel therewithin for accepting telephone termination, connection and protector equipment, and for permitting access to wiring at both front and rear surfaces of said panel; at least one opening in at least one other of said sidewalls for running cabling between said one cabinet and at least one further similar cabinet located in a side-by-side arrangement therewith, panel means for covering said sidewall openings when not in use; at least one opening in each of said top and bottom walls for accommodating incoming and outgoing cables and wiring, and corresponding removable panels for selectively exposing or covering said top wall openings; mounting means for mounting the cabinet securely to a surface, and means defining a grounding system interiorly of said cabinet for grounding of cable jackets and the like entering said cabinet and for grounding said connection and protector equipment.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in connection with the accompanying drawings in which like reference numerals identify like elements, and in which:

FIG. 3 is a front elevation of a network interface cabinet in accordance with another embodiment of the invention:

FIG. 5 is a sectional view taken generally along the line 5—5 of FIG. 3;

FIG. 6 is a side elevation of the network interface cabinet of FIG. 3;

FIG. 7 is a front elevation of the network interface cabinet of either FIG. 1 or FIG. 3, with the door thereof in the closed position.

DETAILED DESCRIPTION OF THE ILLUSTRATED EMBODIMENT

Figure 1:
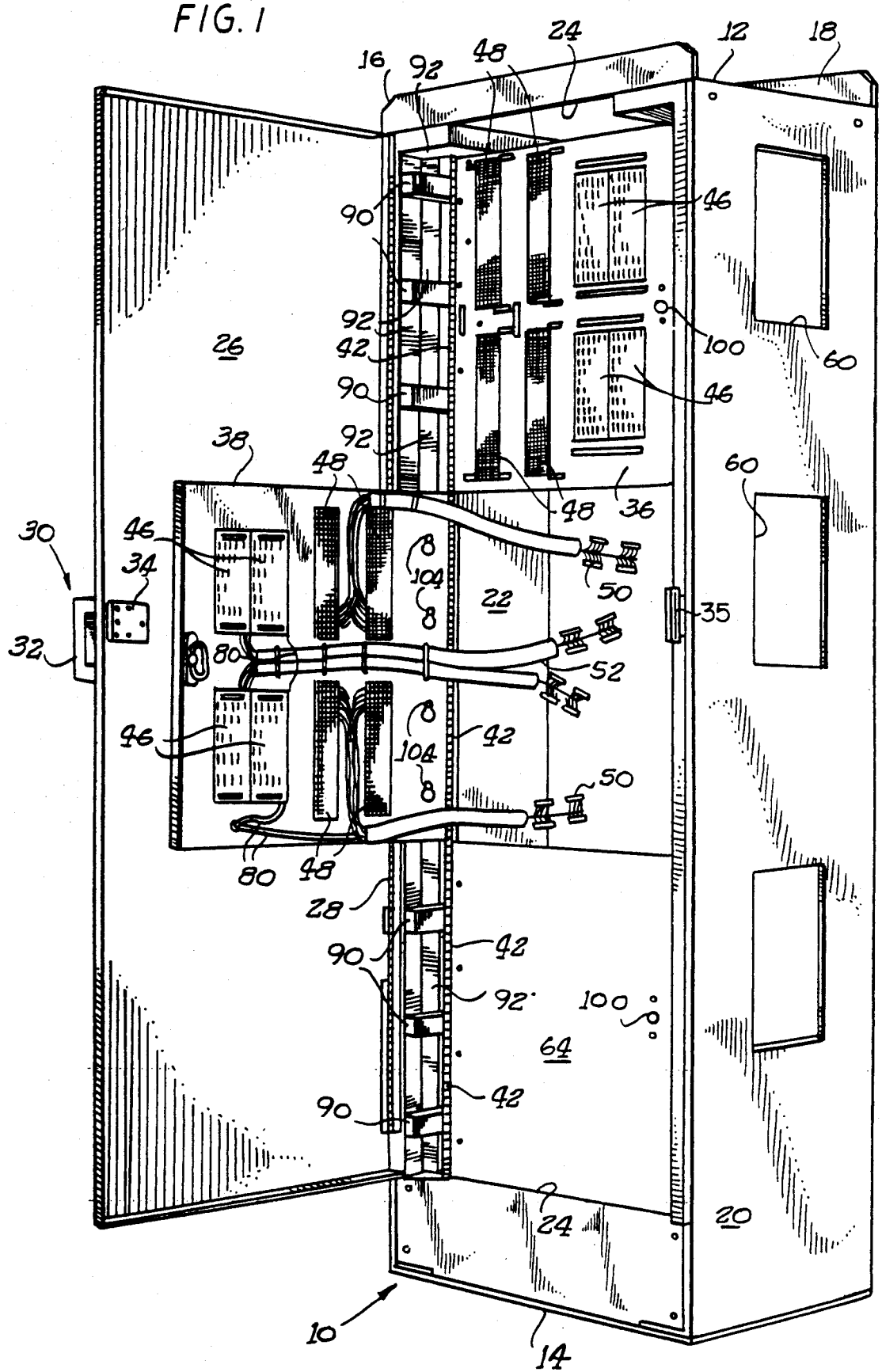
FIG. 1 is a perspective view of a network interface cabinet for large pair count telephone terminations in accordance with the invention.

Referring to the drawings, and initially to FIG. 1, a network interface cabinet for large pair count telephone terminations in accordance with the invention is designated generally by the reference numeral 10. This cabinet is generally rectilinear in form and includes parallel and spaced apart top and bottom walls 12, 14, and two pairs of respective parallel and spaced apart sidewalls 16, 18, 20 and 22 which form respective front, rear and lateral walls of the cabinet. These respective front, rear and lateral sidewalls all generally run between and join the top and bottom walls to define a fully enclosed cabinet for enclosing or housing telephone equipment.

At least one access opening 24 is provided in one of the sidewalls, and preferably in front wall 16, as viewed in FIG. 1. A door or door means 26 is provided for selectively covering and exposing the access opening 24 for selectively permitting access to the telephone equipment located on the inside of the cabinet. In the illustrated embodiment, this door means takes the form of an elongate door which is hingedly mounted along one lateral side 22 thereof by an elongate hinge 28, and preferably a piano-type hinge, which extends along a major fractional portion of the height of the cabinet 10. The door means 26 is further provided with a latching or locking means 30 for limiting or controlling access to the inside of the cabinet. In the illustrated embodiment, these locking means comprise a latched door handle 32 and a key-operated lock 34 mounted thereto. These elements mate with complementary strikes or the like 35 located along the margin of opening 24 generally opposite the hinge 28.

In accordance with a further feature of the illustrated embodiment, additional cable guide means in the form of a plurality of generally similar, parallel and vertically spaced brackets or bracket means 90 are provided along a front lateral portion of the cabinet and preferably adjacent the hinges 42. These brackets 90 are being suitable for receiving and guiding cabling, wiring, or the like to be run to one or more of the panels within the cabinet or even entirely through the cabinet its en route to other locations. Preferably, one end of each of these brackets 90 is mounted on an elongate trough 92 or channel (see FIG. 3) which runs substantially from the top to the bottom of the enclosure within the cabinet for fully shielding and protecting cabling wires running therealong. Accordingly, the brackets 90 and trough provide between them an area accessible from the front of the cabinet, when door 26 is opened, for guiding and running various wires and cords within or through the cabinet.

Mounting means are provided interiorly of the cabinet for hingedly mounting at least one equipment panel 36 therewithin. In the illustrated embodiment this mounting means takes the form of one or more elongate hinges 42, similar in form to the hinge 28 associated with the door 26. The hinge or hinges 92 are preferably arranged parallel to hinge 28 and along the same lateral wall 22, so as to mount the panel 36 for hinged movement generally in the same sense or direction as door 26, within the cabinet 10. This hinged movement is such as to selectively permit access to wiring and equipment on the back side of the panel 36 as viewed in FIG. 1.

A second, similar panel 38 has been illustrated in FIG. 1 rotated outwardly about its corresponding hinge or hinge means 42 for access to the equipment at the rear side thereof in the foregoing fashion. Preferably, each of the panels 36, 38 accepts telephone termination, connection and protector panels or equipment, here indicated diagrammatically as a plurality of modularised protector blocks or terminal blocks 46 and a corresponding plurality of cross-connect field blocks 48. The corresponding rear sides of these protector blocks 46 and cross-connect field blocks 48 are also illustrated on the panel 38, as indicated by the use of like reference numerals. In accordance with the preferred forms of the invention illustrated herein, the rear side of the panel 38 is provided prewired with connectorized stubs 50 and 52 which greatly facilitate wiring of the respective panels 36, 38 to both outgoing and incoming cables.

Figure 8:
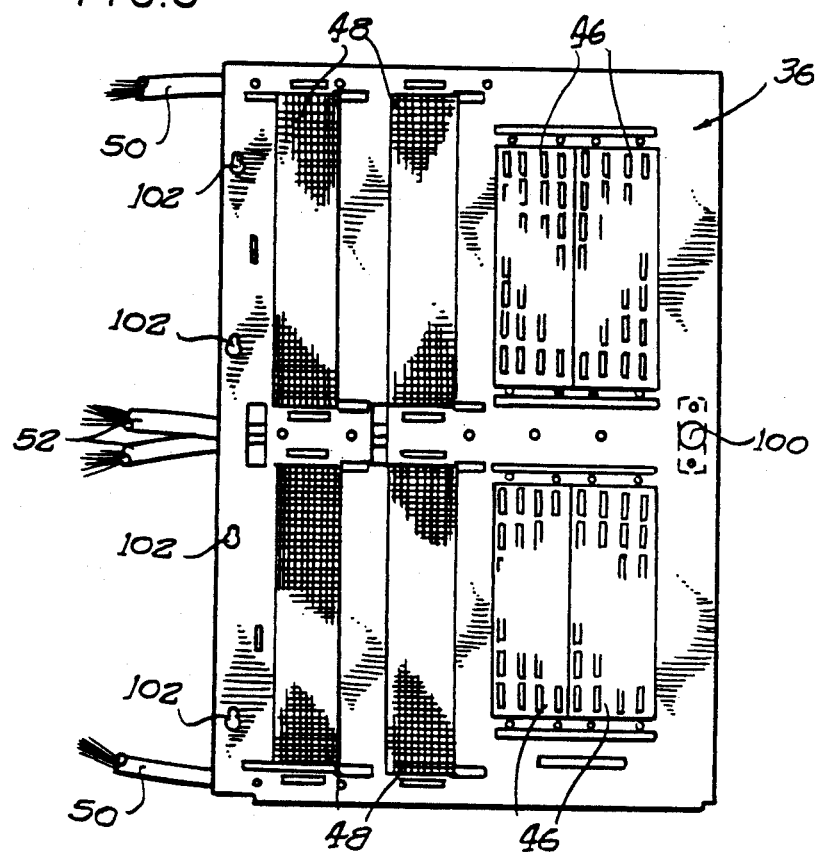
FIGS. 8 and 9 are enlarged views of one type of equipment panels which may be housed within a network interface cabinet in accordance with the invention.
Figure 9:
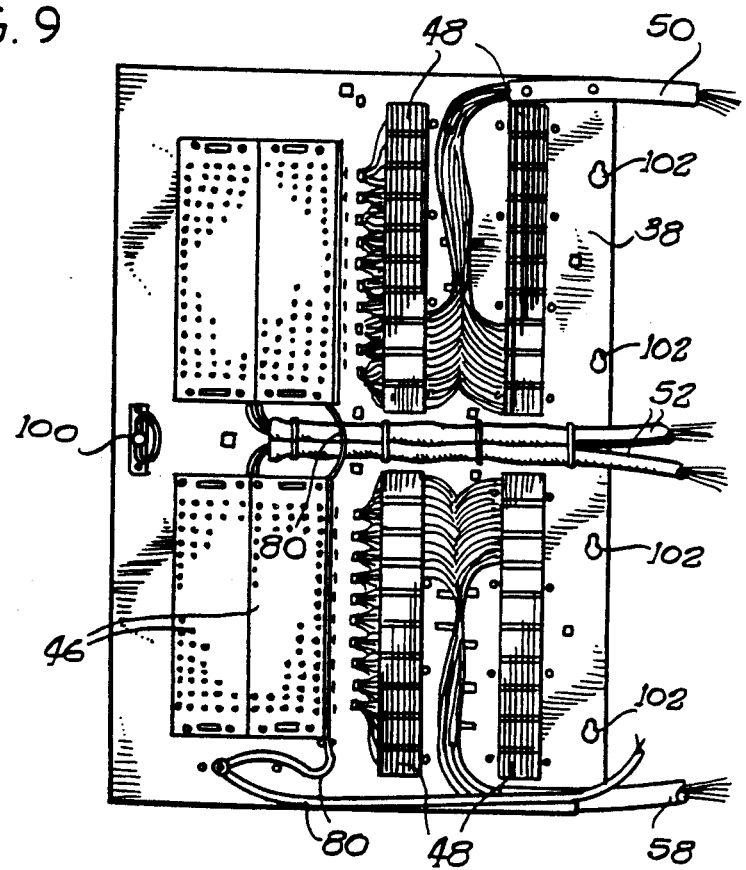

However, it will be understood that other specific types of equipment or other combinations thereof may be mounted to respective panels 36, 38 without departing from the invention. The rear sides (as shown in FIG. 9) of the illustrated protector panels 36, 38 are normally telephone company equipment, and as such, not accessible to the subscriber. For purposes of more fully describing a particular embodiment, however, a "subscriber" equipment panel such as panels 36, 38 may also be equipped with RJ11 connectors and/or RJ21 connectors, with R66 blocks, with E/W "BT" blocks, or with E/W RLS50 blocks. All of the foregoing types of equipment are available from Reliable Electric/Utility Products, 11333 Addison Street, Franklin Park, IL, a Reliance Comm/Tec company. Cooperatively, the opposite sides of RJ11/RJ21 panels preferably include selector blocks for activating either RJ11 or RJ21 lines, preferably including factory installed bridge clips for providing RJ11 connections (sliding the bridge clips to the right provides RJ21 connections). Preferably, the illustrated "protector" panels 36, 38 utilize R66 type blocks for the cross-connect field blocks, and these are preferably equipped with bridge clips which can be removed for cross-connect purposes. Further details of these panels and wiring therefore are indicated in FIGS. 8 and 9.

At least one further through opening 60 is provided in at least one other sidewall, and preferably both lateral sidewalls 20, 22 for accommodating runs of cabling between one or more similar cabinets such as cabinet 10 which may be located in a side-by-side arrangement. In the illustrated embodiment three such openings 60 are provided, but it will be apparent that more or fewer such openings may be utilized without departing from the invention. Preferably, an additional panel or panels 62b (see FIG. 6) may be utilized to cover the openings 60 when the cabinet is not to be located in such a side-by-side arrangement with other cabinets in a configuration requiring the running of cables between multiple cabinets.

Referring again to the lower portion of FIG. 1, and in accordance with a further feature of the embodiment illustrated therein, a blank panel 64 is shown hingedly mounted to hinge means 42 so as to completely separate the cabinet 10 into front and rear portions. These front and rear portions are generally defined or demarcated by the respective panels 36, 38 and 64 when in their "closed" position, as illustrated with respect to panels 36 and 64 in FIG. 1.

Figure 4:
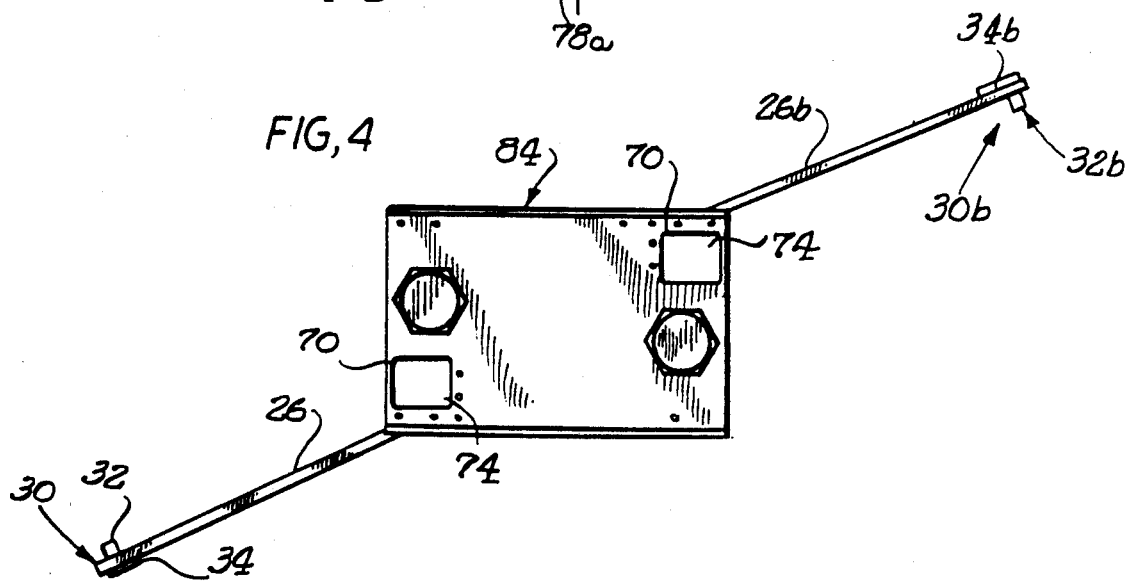
FIG. 4 is a top plan view of the network interface cabinet of FIG. 3.

Referring now also to FIGS. 3 through 7, the cabinet of the invention preferably includes at least one further opening in each of the top and bottom walls for accommodating incoming and outgoing cables and wiring. These openings are indicated in FIGS. 4 and 5 generally by the reference numerals 70 and 72. Preferably, corresponding removable panels 74 are provided for selectively exposing or covering these the opening 70.

Referring to FIG. 5, further mounting means, diagrammatically illustrated as fasteners 78 are preferably provided at the bottom wall 14 for mounting the cabinet securely to a floor or other base surface. Furthermore, a grounding system or grounding means, here illustrated as ground loop cables 80, are preferably provided interiorly of the cabinet for providing a grounding system for all the equipment in the cabinet as well as for all cable jackets and the like entering the cabinet.

Figure 2:
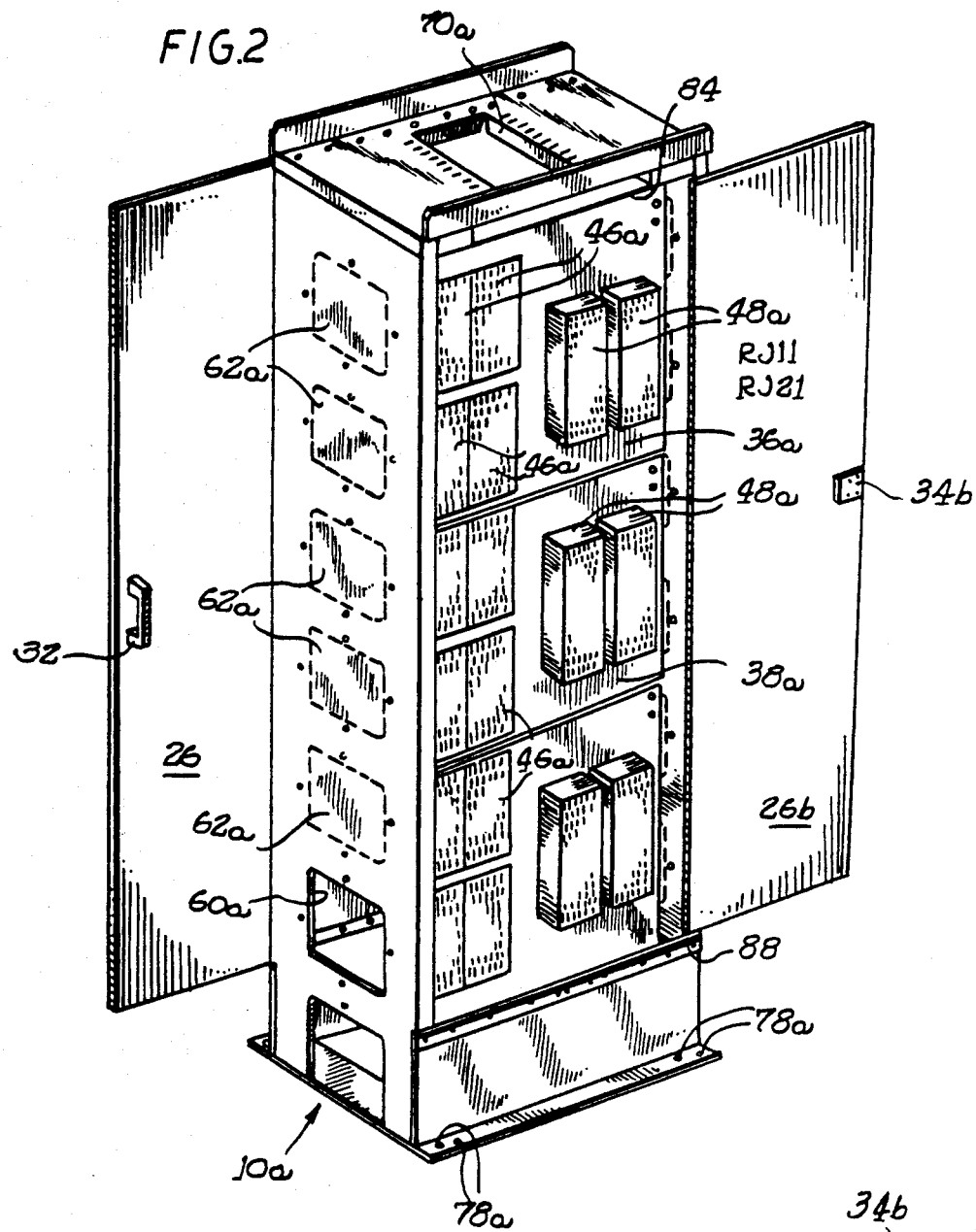
FIG. 2 is a perspective view of an alternative embodiment of a network interface cabinet in accordance with the invention.

In accordance with the embodiment illustrated in FIGS. 2, 3, and 6, a second, rear access opening 84 may also be provided in the cabinet for permitting access to a second oppositely facing set of the panels such as panels 36, 38 which may be housed therein. Cooperatively, an additional door or door means 26b is provided for selectively covering and exposing this second access opening. The door 26b is preferably configured substantially identically with door 26 and is hingedly mounted by hinge 28b along a lateral side of the cabinet in the same fashion as described above with respect to door 26. However, door 26b preferably is hinged to swing in the generally the opposite sense or direction to door 26, as best viewed in FIGS. 2 and 4.

It will be noted that some variations in parts already described hereinabove are present in the somewhat different embodiment shown in FIG. 2, and as such, like reference numerals are used to indicate the parts performing like functions to those described above, however, with the suffix a, to indicate that some structural difference is present.

Referring again to second or rear door 26b, a substantially similar locking arrangement or locking means 30b is provided thereon, which like the locking means 30 comprises a latched door handle 32b and a key-operated lock 34b mounted thereto. In this regard, like parts and components located to the opposite or rear side of the cabinet 10a of FIGS. 2, 3 and 6 are designated by like reference numerals with suffix b. In the "double-door" embodiments illustrated in FIGS. 2, 3, 4 and 6, it is preferred that the locks 34, 34b be configured so that the subscriber may unlock only the one thereof associated with the door which covers subscriber equipment or the subscriber equipment side of the cabinet. Preferably, however the telephone company or operating company will have means for operating both sets of locks for access to all equipment within the cabinet in the event of emergency repairs, diagnostic work, or the like.

Each of the panels such as panels 36, 38 and 64, as best viewed in FIGS. 1, 8 and 9 is further provided with additional locking means, as generally indicated at 100, for permitting the panels to be locked in place in the hingedly closed position, that is, as shown with respect to panels 36 and 64 in FIG. 1. These locking means further control or limit access to the back sides of the respective panels and to any equipment housed in the cabinet therebehind. Stated another way, these additional locking means may be utilized to prevent subscriber access to telephone company equipment behind or at the rear sides (in a "double door" cabinet) of the respective subscribers panels.

As best viewed in FIGS. 8 and 9, the respective modular equipment panels such as panels 36 and 38 are also preferably provided with keyhole-shaped mounting slots 102, to facilitate the mounting and removal thereof relative to the respective hinges 42. Cooperatively, the hinges 42 are preferably provided with protruding bolt heads 104 (see FIG. 1) which may be loosened somewhat in order to permit mounting of keyhole slots 102 thereover and then tightened down in order to secure the respective panels to respective portions of the hinges 42 in the manner illustrated in FIG. 1.

While particular embodiments of the invention have been shown and described in detail, it will be obvious to those skilled in the art that changes and modifications of the present invention, in its various aspects, may be made without departing from the invention in its broader aspects, some of which changes and modifications being matters of routine engineering or design, and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

The invention is claimed as follows:

1. A network interface cabinet for large pair count telephone terminations comprising: a generally rectilinear cabinet including parallel and spaced top and bottom walls and two pairs of parallel spaced apart sidewalls forming respective, front, rear and lateral walls running between and joining said top and bottom walls; at least one first access opening in one of said sidewalls, door means for selectively covering and exposing said access opening for first access to the inside of the cabinet; hinge means located interiorly of the cabinet for hingedly mounting at least one equipment panel therewithin for accepting telephone termination, connection and protector equipment, and for allowing movement of the panel to permit access to wiring at both front and rear surfaces of said panel; at least one opening in at least one other of said sidewalls for running cabling between said one cabinet and at least one further similar cabinet located in a side-by-side arrangement therewith, removable panel means for covering said at least one opening in said at least one other of said sidewalls when not in use; at least one opening in each of said top and bottom walls for accommodating incoming and outgoing cables and wiring, and corresponding removable panels for selectively exposing or covering said top openings; mounting means for mounting the cabinet securely to a surface, and means defining a grounding system interiorly of said cabinet for grounding of cable jackets and the like entering said cabinet and for grounding said connection and protector equipment; and further including an elongate channel, said channel running substantially from the top to the bottom of said cabinet and defining an axis generally in parallel with and between the door means and the hinge means interiorly of the cabinet for mounting the equipment panel, such that cabling within said channel is protected during opening and closing movements of both the first access door means and the hinged equipment panel.

2. A cabinet according to claim 1 and further including a second access opening in one of said sidewalls opposite said first access opening, second door means for selectively covering and exposing said second access opening, and first and second locking means operatively coupled with said first and second door means respectively and said cabinet for controlling access to said cabinet throughs aid first and second openings; whereby subscriber access can be limited to subscriber-owned lines and equipment accessible through only one of said first and second openings, while preventing subscriber access to telephone company equipment accessible through the other of said first and second openings.

3. A cabinet according to claim 1 and further including a plurality of removable equipment panels hingedly mounted on said hinge means; manually removable means comprising protruding mounting bolt heads on said hinge means and key-hole shaped mounting slots on said equipment panels shaped for engagement with said mounting bolts for permitting manual mounting and removal of panels relative to said hinge means without the use of any tools.

4. A cabinet according to claim 1 wherein said first door means is hinged along a lateral side thereof and includes a latched door handle including a key-operated lock mounted thereto.

5. In combination with the cabinet as claimed in claim 1, a substantially identical cabinet arranged side-by-side with said first cabinet and said first cabinets having respective sidewall access openings aligned one with the other for passing cables and the like therebetween; and further including locking means associated with the doors of each of said cabinets arranged for permitting access by the subscriber to only one of said cabinets, said one cabinet containing only subscriber-owned equipment.

6. A cabinet according to claim 1 and further including equipment panel locking means mounted to said equipment panel for locking the same against hinged movement, to thereby control access to at least one side of said equipment panel.

7. A cabinet according to claim 1 wherein said at least one equipment panel has mounted at one side thereof a terminal block for providing terminations and connections for a plurality of line pairs and for providing cross connect fields, and wherein the opposite side thereof mounts a protector block for accommodating protector modules.

8. A cabinet according to claim 7 wherein at least one side of said panel is provided with connectorized stubs to facilitate splicing.

9. A cabinet according to claim 8 wherein said one side provided with connectorized stubs comprises the protector module side of said panel and wherein said one side further is prewired for coupling said protector modules to corresponding terminals for terminating and providing protection for corresponding line pairs.

10. A network interface cabinet for large pair count telephone terminations comprising: a generally rectilinear cabinet including parallel and spaced top and bottom walls and two pairs of parallel spaced apart sidewalls forming respective, front, rear and lateral walls running between and joining said top and bottom walls; at least one access opening in one of said sidewalls, door means for selectively covering and exposing said access opening for access to the inside of the cabinet; hinge means located interiorly of the cabinet for hingedly mounting at least one equipment panel therewithin for accepting telephone termination, connection and protector equipment, and for allowing movement of the panel to permit access to wiring at both front and rear surfaces of said panel; at least one opening in at least one other of said sidewalls for running cabling between said one cabinet and at least one further similar cabinet located in a side-by-side arrangement therewith, removable panel means for covering said at least one opening in said at least one other of said sidewalls when not in use; at least one opening in each of said top and bottom walls for accommodating incoming and outgoing cables and wiring, and corresponding removable panels for selectively exposing or covering said top openings; mounting means for mounting the cabinet securely to a surface, and means defining a grounding system interiorly of said cabinet for grounding of cable jackets and the like entering said cabinet and for grounding said connection and protector equipment; and further including manually removable means comprising protruding mounting bolt heads on said hinge means and key-hole shaped mounting slots on said equipment panel shaped for engagement with said mounting bolts for permitting manual mounting and removal of panels relative to said hinge means without the use of any tools.

* * * * *